(12) United States Patent
Olsen et al.

(10) Patent No.: US 6,545,494 B1
(45) Date of Patent: Apr. 8, 2003

(54) APPARATUS AND METHOD FOR CONTROLLING TEMPERATURE IN A WAFER USING INTEGRATED TEMPERATURE SENSITIVE DIODE

(75) Inventors: Douglas S. Olsen, Natick, MA (US); David Stura, North Billerica, MA (US)

(73) Assignee: Temptronic Corporation, Sharon, MA (US)

( * ) Notice: Subject to any disclaimer, the term of this patent is extended or adjusted under 35 U.S.C. 154(b) by 0 days.

(21) Appl. No.: 09/612,667

(22) Filed: Jul. 10, 2000

(51) Int. Cl.[7] ............................................. G01R 31/02
(52) U.S. Cl. ..................................... 324/760; 324/73.1
(58) Field of Search ................................ 324/73, 158.1, 324/760, 73.1, 763, 765; 62/3.3, 208, 3, 62; 236/78; 200/300, 207; 165/61, 80.3; 219/209; 374/57, 135; 702/130, 132; 713/300, 320, 340

(56) References Cited

U.S. PATENT DOCUMENTS

| | | | | |
|---|---|---|---|---|
| 4,622,515 A | * | 11/1986 | Everson | 324/767 |
| 4,734,872 A | * | 3/1988 | Eager | 700/300 |
| 4,848,090 A | * | 7/1989 | Peters | 62/3.3 |
| 5,123,850 A | * | 6/1992 | Elder | 439/67 |
| 5,154,514 A | | 10/1992 | Gambino et al. | 374/178 |
| 5,205,132 A | * | 4/1993 | Fu | 62/208 |
| 5,281,026 A | | 1/1994 | Bartilson et al. | 374/143 |
| 5,498,971 A | | 3/1996 | Turnbull et al. | 324/760 |
| 5,875,142 A | | 2/1999 | Chevallier | 365/212 |
| 6,279,832 B1 | * | 8/2001 | Duchatelet | 326/78 |

FOREIGN PATENT DOCUMENTS

| | | | |
|---|---|---|---|
| DE | 196 52 046 | 6/1998 | |
| WO | WO 99/34159 | 7/1999 | F25B/29/00 |

* cited by examiner

Primary Examiner—Kamand Cuneo
Assistant Examiner—Trung Nguyen
(74) Attorney, Agent, or Firm—Mills & Onello LLP

(57) ABSTRACT

An apparatus and method for controlling temperature in a wafer on a wafer chuck includes a temperature sensing device, such as a temperature sensitive diode, integrally formed in the wafer. A sensing circuit senses a signal from the diode indicative of temperature of the wafer. The sensing circuit can be part of a testing circuit in a wafer prober being used to test integrated circuits on the wafer. The sensing circuit sends a control signal to a temperature control system used to control the temperature of the chuck. In response to the control signal, the temperature control system controls the temperature of the chuck at a desired temperature to control the temperature of the wafer. The wafer can include multiple integrated circuit die, and each circuit can include its own temperature sensing diode. As a result, extremely accurate and individualized temperature testing can be performed on each integrated circuit on the wafer.

37 Claims, 2 Drawing Sheets

APPARATUS AND METHOD FOR CONTROLLING TEMPERATURE IN A WAFER USING INTEGRATED TEMPERATURE SENSITIVE DIODE

FIELD OF THE INVENTION

The present invention relates to wafer testing and in particular to controlling temperature in a wafer during testing.

BACKGROUND OF THE INVENTION

In the semiconductor integrated circuit industry, the cost of individual integrated circuit chip die is continuing to decrease in comparison to IC package costs. Consequently, it is becoming more important to perform many IC process steps while the die are still in the wafer, rather than after the relatively expensive packaging steps have been performed.

Typically, in IC processing, semiconductor wafers are subjected to a series of test and evaluation steps. For each step, the wafer is held in a stationary position at a process station where the process is performed. For example, circuit probe testing is increasingly performed over a wide temperature range to temperature screen the ICs before assembly into a package. The wafer is typically held stationary relative to a vacuum support surface of a prober machine which electrically tests the circuits on the wafer. The prober includes a group of electrical probes in a probe head which is positioned such that the probes are brought into contact with predetermined contact points on individual circuits formed in the wafer. The probes, in conjunction with a tester, apply predetermined electrical excitations to various predetermined portions of the circuits on the wafer and sense the circuits' responses to the excitations.

In a typical prober system, the wafer is mounted on the top surface of a wafer chuck, which is held at its bottom surface to a support structure of the prober. A vacuum system is typically connected to the chuck. A series of channels or void regions in communication with the top surface of the chuck conduct the vacuum to the wafer to hold it in place on the top surface of the chuck. The prober support structure is then used to locate the wafer under the probes as required to perform the electrical testing on the wafer circuits.

The chuck can also include a temperature control system which raises and lowers the temperature of the chuck surface to maintain the chuck surface at a desired set point temperature. Temperature control systems for the chuck can take several forms. For example, the chuck can be outfitted with electrical heaters which are controlled to provide heat to the chuck and raise the temperature of the wafer. The chuck can also include a heat sink for removing heat from the chuck. The temperature control system can also include a means for circulating a fluid through the chuck to cool and/or heat the chuck.

The set point temperature of the chuck is selected based on a desired testing temperature for the wafer. The chuck typically includes a temperature sensor mounted within the chuck in close proximity to its top surface and, therefore, the wafer mounted thereon. Since the temperature sensor is located close to the wafer, it is assumed that the temperature at the top surface of the chuck is the same as the temperature of the wafer circuit being tested and that any difference in temperature between the two is negligible.

In many modern circuit testing settings, this assumption can lead to inaccurate testing results. For example, in many circuits, power dissipation is relatively high. This results in substantial localized heating of the circuit or adjacent circuits when the circuit testing excitation signal is applied by a tester operating with the prober. The result is that the circuit is actually tested at a much higher temperature than the temperature set by the system, and the accuracy of the test is reduced.

Therefore, it would be beneficial to have a temperature control system for controlling the temperature of a wafer under test in which temperature sensing is realized at the actual circuit or wafer being tested.

SUMMARY OF THE INVENTION

The present invention is directed to an apparatus and method for controlling the temperature of at least a portion of an integrated circuit wafer which overcomes the drawbacks of the prior art. The apparatus of the invention includes a temperature sensing device integrally formed in the integrated circuit wafer. A sensing circuit receives from the temperature sensing device a signal indicative of temperature of the integrated circuit wafer. A temperature control medium is in thermal communication with the wafer. The temperature of the temperature control medium is controlled by a temperature control system. The temperature control system uses the signal indicative of the temperature of the wafer to control the temperature of the temperature control medium such that the temperature of the wafer is controlled.

In one embodiment, the temperature control medium is a temperature-controlled workpiece chuck on which the wafer is supported. In another embodiment, the temperature control medium is a stream of a temperature-controlled gas such as air which is directed onto the wafer.

The temperature sensing device formed in the wafer can be a temperature-sensitive diode. An excitation current can be driven through the diode by the prober tester, and the resulting voltage drop across the diode can be sensed. In such a diode, the voltage drop across the diode changes with temperature. Therefore, the sensed voltage drop can be used to generate the signal indicative of temperature of the wafer.

Hence, in one embodiment, the sensing circuit can be part of a testing circuit in a wafer prober machine used to test integrated circuits formed in the wafer. The testing circuit can be coupled to the temperature control system. The signal indicative of temperature of the wafer is used to generate a control signal which is applied to the temperature control system and is used by the temperature control system to control the temperature of the temperature control medium, e.g., the chuck or the air stream.

The temperature control approach of the invention can be applied to testing multiple individual integrated circuit die while they are still attached within a wafer. Accordingly, each individual circuit is formed with its own integral temperature sensing device, i.e., diode. As each circuit is tested by the prober, its respective temperature signal is sensed at its respective integral diode. The temperature for the particular circuit under test can then be adjusted based on its locally sensed temperature, thus assuring highly accurate temperature data for each test.

In one embodiment, the temperature control process used in the invention directly controls the temperature of the temperature control medium, i.e., chuck or air stream, to control the temperature of the wafer. That is, in the chuck system, the temperature of the chuck is controlled to reach and stabilize at a desired chuck temperature set point. If the chuck is at its desired set point and the wafer is not at its desired temperature, then a new set point is selected for the chuck. The set point for the chuck continues to be adjusted to maintain the temperature of the wafer at its desired temperature. Likewise, in the air stream system, the temperature of the air stream is sensed, and the sensed temperature is used to control the temperature of the air stream to maintain it at a desired set point. If the air stream temperature is at its set point and the wafer is not, then a new air stream set point is selected. This continues until the desired temperature is reached. Hence, in either system, the set point for the temperature control medium, i.e., chuck or air stream, is in general different than the set point for the wafer.

This type of control can be regarded as a "dual-loop" control in which two types of feedback are used to achieve the ultimate desired output. Such dual-loop temperature control, which can be used in accordance with one embodiment of the invention, is described in, for example, U.S. Pat. No. 4,734,872, entitled, "Temperature Control for Device Under Test," issued Mar. 29, 1988, assigned to Temptronic Corporation, and incorporated herein in its entirety by reference.

The temperature control approach used in accordance with the invention is used to precisely control the temperature of the wafer circuit being tested, with temperature sensing being realized at the circuit under test, not at a relatively remote location. As a result, the temperature control tests performed in connection with the temperature control of the invention are more accurate than tests performed using prior approaches to temperature control.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
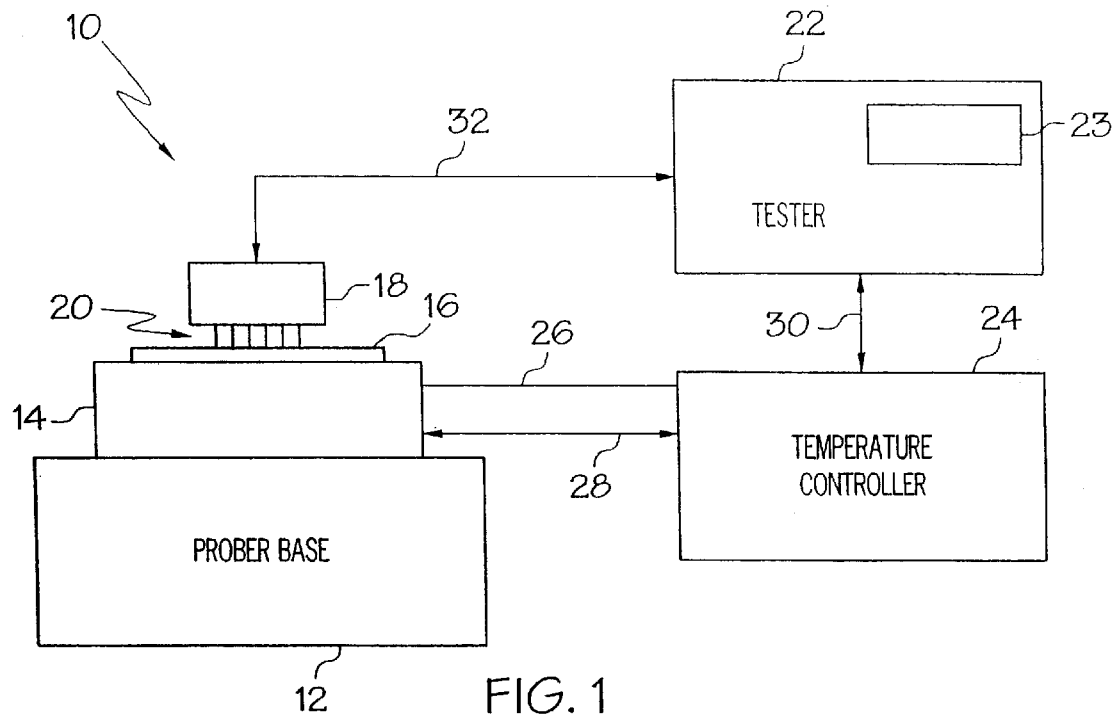
FIG. 1 is a schematic block diagram of a wafer testing system using temperature control in accordance with the invention.

FIG. 1 is a schematic block diagram of a circuit testing system, particularly a wafer probing system 10, which includes the temperature control apparatus and method of the invention. The system 10 includes a prober base 12 on which is mounted a temperature-controlled wafer chuck 14 used to support a wafer under test 16 during testing. The chuck 14 can be of the types described in U.S. Pat. No. 6,019,164, issued Feb. 1, 2000, entitled, "Workpiece Chuck," assigned to Temptronic Corporation, and incorporated herein in its entirety by reference; U.S. Pat. No. 6,073,681, issued Jun. 13, 2000, entitled, "Workpiece Chuck," assigned to Temptronic Corporation, and incorporated herein in its entirety by reference; and copending U.S. patent application Ser. No. 09/473,099, filed on Dec. 28, 1999, entitled, "Workpiece Chuck," assigned to Temptronic Corporation, and incorporated herein in its entirety by reference.

The temperature of the chuck 14 is controlled by temperature controller 24 via an electrical interface generally identified by reference numeral 28 and a thermal interface identified by reference numeral 26. The thermal interface 26 can include, for example, tubes for circulating a temperature-controlled fluid through the chuck 14. The electrical interface can be used, for example, to provide power to heaters in the chuck 14. The temperature of the chuck 14 can be controlled in accordance with copending U.S. patent application Ser. No. 09/001,887, filed on Dec. 31, 1997, entitled, "Temperature Control System for a Workpiece Chuck," assigned to Temptronic Corporation, and incorporated herein in its entirety by reference.

The prober includes a tester circuit 22 which controls a test head 18 which physically interfaces with circuits on the wafer 16 via a set of prober pins or probes 20. The tester 22 applies test stimulus signals to the circuit under test and receives response signals via the pins 20 in the test head 18 and the interface generally identified by reference numeral 32.

Figure 3:
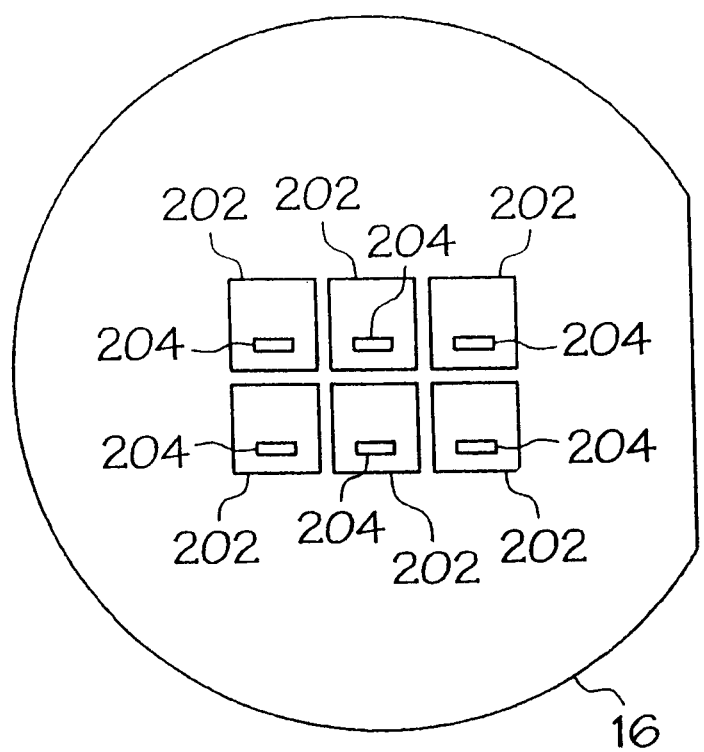
FIG. 3 is a schematic plan view of an integrated circuit wafer having multiple integrated circuits formed with integral temperature sensing diodes, for use with the temperature control apparatus and method of the invention.

FIG. 3 is a schematic top plan view of the wafer 16. As shown in FIG. 3, the wafer 16 includes multiple integrated circuits 202 formed in the wafer by known integrated circuit fabrication processes. Each circuit 202 also includes a temperature sensing device, such as a temperature sensitive diode 204, formed integrally in the wafer 16 with the circuits 202. These diodes 204 can be formed at the same time as the circuits 202 as part of the circuit fabrication process, or they can be formed in a separate fabrication process. The diodes 204 operate such that, during operation, as they conduct current, the voltage drop across them varies with temperature in a known and characterized fashion. Hence, a measurement of the voltage drop across the diode 204 can be used to determine the temperature of the diode 204 and, therefore, its respective associated circuit 202 under test.

Referring again to FIG. 1, the tester 22 applies the test stimulus signals to a particular circuit under test on the wafer 16. The response signals are received and processed by the tester 22. The tester 22 includes a temperature testing circuit 23 which receives and processes the signal from the temperature sensitive diode 204 in the circuit 202 under test. The signal is processed and a resulting control signal is generated and applied to the temperature controller 24. The signal processed by the circuit 23 is indicative of the temperature of the circuit 202 under test. The control signal sent to the temperature controller 24 is used to select the set point temperature for the chuck to adjust the chuck temperature until the signal processed by the circuit 23 indicates that the circuit 202 under test is at the desired set temperature.

This approach is referred to herein as a "dual-loop" control approach. A first control loop is used to control the temperature of the chuck 14 to maintain the chuck temperature at the desired chuck set point temperature. The second loop is used to control the set point temperature of the chuck 14 such that the desired wafer circuit temperature is maintained. Such a dual-loop temperature control is described in U.S. Pat. No. 4,734,872, cited above and incorporated herein in its entirety by reference.

Figure 2:
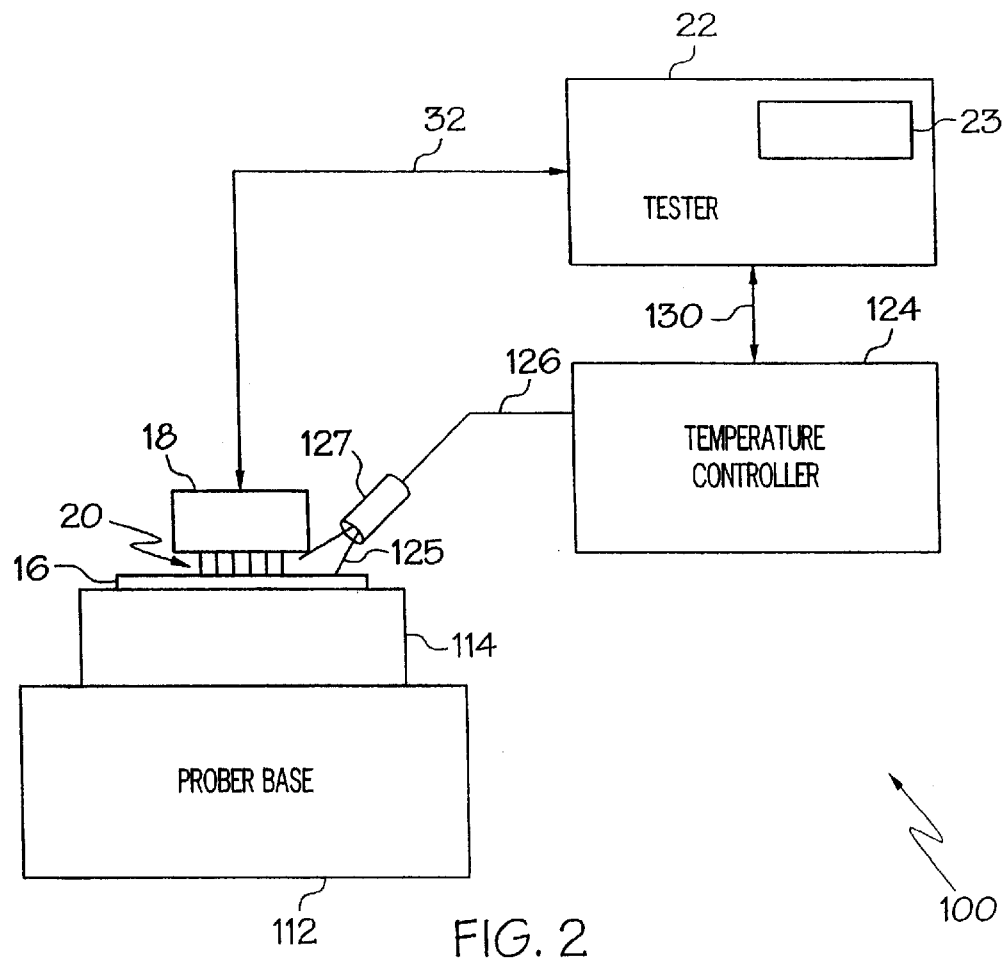
FIG. 2 is a schematic block diagram of another wafer testing system using temperature control in accordance with the invention.

FIG. 2 is a schematic block diagram of another circuit test system 100 which implements the temperature control approach of the invention. In this embodiment, instead of controlling the temperature of the chuck 114 on which the wafer 16 is mounted, a stream of temperature-controlled gas 125 is directed onto the wafer 16 by a nozzle 127 and gas tube 126 from a gas temperature controller 124. The stream type temperature control system can be of the type described in U.S. Pat. No. 4,734,872 cited above and incorporated herein in its entirety by reference.

In accordance with the dual-loop control approach, the temperature controller 124 maintains the temperature of the gas at a set point temperature. If the signal processed by the circuit 23 indicates that the circuit 202 under test is not at its desired temperature, a control signal sent to the temperature controller 124 selects a new set point. This process continues until the circuit under test is maintained at the desired temperature.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. An apparatus for controlling temperature of at least a portion of an integrated circuit wafer comprising:
    an integral temperature sensing device integrally fabricated within the integrated circuit wafer;
    a sensing circuit for receiving a signal from the temperature sensing device indicative of temperature of the integrated circuit wafer;
    a temperature control medium in thermal communication with the integrated circuit wafer;
    a temperature control system for controlling temperature of the temperature control medium, the temperature control system using the signal indicative of temperature of the integrated circuit wafer to control the temperature of the temperature control medium such that the temperature of integrated circuit wafer is controlled.

2. The apparatus of claim 1 wherein the temperature control medium is a temperature-controlled chuck on which the wafer is supported.

3. The apparatus of claim 1 wherein the temperature control medium is a temperature-controlled stream of gas directed onto the wafer.

4. The apparatus of claim 3 wherein the gas is air.

5. The apparatus of claim 1 wherein the temperature sensing device is a temperature sensitive diode fabricated within the integrated circuit wafer.

6. The apparatus of claim 1 wherein each of a plurality of portions of the integrated circuit wafer includes an integral temperature sensing device such that the temperature of each of the plurality of portions of the integrated circuit wafer can be controlled.

7. The apparatus of claim 6 wherein each of the plurality of portions of the integrated circuit wafer is an individual integrated circuit chip die in the wafer.

8. The apparatus of claim 1 wherein the sensing circuit is part of a testing circuit in a wafer prober machine used to test an integrated circuit formed in the portion of the integrated circuit wafer.

9. The apparatus of claim 8 wherein the testing circuit of the wafer prober machine is coupled to the temperature control system, the testing circuit using the signal indicative of temperature of the integrated circuit wafer to generate a control signal applied to the temperature control system and used by the temperature control system to control the temperature of the temperature control medium.

10. The apparatus of claim 9 wherein the control signal is used by the temperature control system to set the temperature of the temperature control medium at a first temperature set point such that the temperature of the portion of the integrated circuit wafer is controlled at a desired wafer temperature set point.

11. A method of controlling temperature of at least a portion of an integrated circuit wafer on a chuck comprising:
    integrally forming a temperature sensing device within the integrated circuit wafer;
    receiving a signal from the temperature sensing device indicative of temperature of the integrated circuit wafer;
    providing a temperature control medium in thermal communication with the integrated circuit device;
    using the signal indicative of temperature of the integrated circuit wafer, controlling temperature of the temperature control medium such that the temperature of the integrated circuit wafer is controlled.

12. The method of claim 11 wherein the temperature control medium is a temperature-controlled chuck on which the wafer is supported.

13. The method of claim 11 wherein the temperature control medium is a temperature-controlled stream of gas directed onto the wafer.

14. The method of claim 13 wherein the gas is air.

15. The method of claim 11 wherein integrally forming the temperature sensing device within the integrated circuit wafer comprises integrally forming a temperature sensitive diode within the integrated circuit wafer.

16. The method of claim 11 wherein each of a plurality of portions of the integrated circuit wafer includes an integral temperature sensing device such that the temperature of each of the plurality of portions of the integrated circuit wafer can be controlled.

17. The method of claim 16 wherein each of the plurality of portions of the integrated circuit wafer is an individual integrated circuit chip die in the wafer.

18. The method of claim 11 wherein the signal indicative of temperature in the integrated circuit wafer is received by a sensing circuit in a testing circuit in a wafer prober machine used to test an integrated circuit formed in the portion of the integrated circuit wafer.

19. The method of claim 18 further comprising, with the testing circuit, using the signal indicative of temperature of the integrated circuit wafer to generate a control signal for controlling the temperature of the temperature control medium.

20. The method of claim 19 wherein the control signal is used to set the temperature of the temperature control medium at a first temperature set point such that the temperature of the portion of the integrated circuit wafer is controlled at a desired wafer temperature set point.

21. An apparatus for controlling temperature of at least a portion of an integrated circuit device comprising:
    an integral temperature sensing device integrally fabricated within the integrated circuit device;
    a sensing circuit for receiving a signal from the temperature sensing device indicative of temperature of the integrated circuit device;
    a temperature control medium in thermal communication with the integrated circuit device;
    a temperature control system for controlling temperature of the temperature control medium, the temperature control system using the signal indicative of temperature of the integrated circuit device to control the temperature of the temperature control medium such that the temperature of integrated circuit device is controlled.

22. The apparatus of claim 21 wherein the temperature control medium is a temperature-controlled chuck on which the device is supported.

23. The apparatus of claim 21 wherein the temperature control medium is a temperature-controlled stream of gas directed onto the device.

24. The apparatus of claim 23 wherein the gas is air.

25. The apparatus of claim 21 wherein the temperature sensing device is a temperature sensitive diode fabricated within the integrated circuit device.

26. The apparatus of claim 21 wherein each of a plurality of portions of the integrated circuit device includes an integral temperature sensing device such that the temperature of each of the plurality of portions of the integrated circuit device can be controlled.

27. The apparatus of claim 21 wherein the sensing circuit is part of a testing circuit coupled to the temperature control system, the testing circuit using the signal indicative of temperature of the integrated circuit device to generate a control signal applied to the temperature control system and used by the temperature control system to control the temperature of the temperature control medium.

28. The apparatus of claim 27 wherein the control signal is used by the temperature control system to set the temperature of the temperature control medium at a first temperature set point such that the temperature of the portion of the integrated circuit device is controlled at a device temperature set point.

29. A method of controlling temperature of at least a portion of an integrated circuit device comprising:

integrally forming a temperature sensing device within the integrated circuit device;

receiving a signal from the temperature sensing device indicative of temperature of the integrated circuit device;

providing a temperature control medium in thermal communication with the integrated circuit device;

using the signal indicative of temperature of the integrated circuit device, controlling temperature of the temperature control medium such that the temperature of integrated circuit device is controlled.

30. The method of claim 29 wherein the temperature control medium is a temperature-controlled chuck on which the device is supported.

31. The method of claim 29 wherein the temperature control medium is a temperature-controlled stream of gas directed onto the device.

32. The method of claim 31 wherein the gas is air.

33. The method of claim 29 wherein integrally forming the temperature sensing device within the integrated circuit device comprises integrally forming a temperature sensitive diode within the integrated circuit device.

34. The method of claim 29 wherein each of a plurality of portions of the integrated circuit device includes an integral temperature sensing device such that the temperature of each of the plurality of portions of the integrated circuit device can be controlled.

35. The method of claim 29 wherein the signal indicative of temperature in the integrated circuit device is received by a sensing circuit in a testing circuit used to test an integrated circuit formed in the portion of the integrated circuit device.

36. The method of claim 35 further comprising, with the testing circuit, using the signal indicative of temperature of the integrated circuit device to generate a control signal for controlling the temperature of the temperature control medium.

37. The method of claim 36 wherein the control signal is used to set the temperature of the temperature control medium at a first temperature set point such that the temperature of the portion of the integrated circuit device is controlled at a device temperature set point.

* * * * *